United States Patent [19]
Yamada et al.

[11] Patent Number: 5,354,986
[45] Date of Patent: Oct. 11, 1994

[54] ION IMPLANTATION APPARATUS

[75] Inventors: Satoshi Yamada; Hirohisa Yamamoto; Shigeru Shiratake, all of Itami, Japan

[73] Assignee: Mitsubishi Denki Kabushiki Kaisha, Tokyo, Japan

[21] Appl. No.: 974,873

[22] Filed: Nov. 12, 1992

[30] Foreign Application Priority Data

Nov. 12, 1991 [JP] Japan .................... 3-295899

[51] Int. Cl.$^5$ .................... H01J 37/30; H05H 3/00
[52] U.S. Cl. .................... 250/251; 250/492.21
[58] Field of Search .................... 250/251, 398, 492.21

[56] References Cited

U.S. PATENT DOCUMENTS

| | | | |
|---|---|---|---|
| 4,361,762 | 11/1982 | Douglas | 250/251 |
| 4,786,814 | 11/1988 | Kolondra et al. | 250/398 |
| 5,089,710 | 2/1992 | Kikuchi et al. | 250/442.11 |

*Primary Examiner*—Bruce C. Anderson
*Attorney, Agent, or Firm*—Leydig, Voit & Mayer

[57] ABSTRACT

An ion implantation apparatus includes a charge neutralizer having a control circuit which controls the quantity of secondary electrons irradiating a semiconductor wafer. Electrons are generated in response to a direction of movement of a semiconductor wafer to neutralize positive charge on the semiconductor wafer. The apparatus can neutralize the positive charge homogeneously and prevent electrical breakdown of the semiconductor wafer.

1 Claim, 5 Drawing Sheets

ION IMPLANTATION APPARATUS

BACKGROUND OF THE INVENTION

FIELD OF THE INVENTION

The present invention relates to an ion implantation apparatus. More particularly, the present invention relates to an ion implantation apparatus producing a high current and equipped with an electron neutralizing unit in order to neutralize the positive charge on a semiconductor wafer during implantation of cations in the semiconductor wafer.

DESCRIPTION OF THE RELATED ART

FIG. 3 is a schematic sectional view of a conventional ion implantation apparatus producing high current. As shown in FIG. 3, the filament 2 for emitting thermal electrons is provided in the arc chamber 1 of an ion source. An ion drawing electrode 3 to draw ions generated in the arc chamber 1 is disposed in the vicinity of the arc chamber 1. A mass spectrometer 4 draws only ions having a predetermined mass out of the ions from the ion drawing electrode 3. If ions not having a predetermined mass in the ions from the mass spectrometer 4 are included, an analytical slit 5 removes these ions. The area of an ion beam 1b passing through to the analytical slit 5 is restricted by a molded slit 6, and then the ion beam is inculent on the surface of plural semiconductor wafers 9 placed on a disc 8. The amount of the beam current of the ion beam 1b is measured by a Faraday tube 7 of a beam current measuring instrument system.

The conventional ion implantation apparatus is composed as described above. First, a gas (AsH$_3$ and the like) containing an element to be implanted is sent into the arc chamber 1 of an ion source. When an electric current is supplied, thermal electrons are emitted from the arc chamber 1, and ions such as $^{75}$As+, As++ and As$_2$+ are generated because a plasma state is caused in the arc chamber 1 due to collisions of thermal electrons with the gas molecules. The ions can be extracted through a beam drawing slit 1a in the arc chamber 1 by applying negative bias voltage to an ion drawing electrode 3. Since different isotopes and heterogeneous ions such as As++ and As$_2$+ are present together in the emitted ion beam 1b, the mass spectrometer 4 is utilized to draw the desired $^{75}$As+ out of them.

In the mass spectrometer, the mass of an ion is selected by varying the magnetic field. An ion having heavier mass than that of $^{75}$As+ crashes into the inside 4a of the wall 4 because of its overrunning curve, but an ion having lighter mass than that of $^{75}$As+ crashes into the inside 4b of the wall 4 because it curves too much. In the ion beam 1b mainly containing $^{75}$As+, ions having heavier and lighter mass than that of $^{75}$As+ are removed by passing throguh the analytical slit 5, and then the molded slit 6 restricts the area of the beam. The ion beam 1b passes through the Faraday tube of the beam current measuring instrument system and is implanted in the semiconductor wafer placed on the disc 8.

As shown in FIG. 4, an electron neutralizing unit 10 is equipped in the Faraday tube 7 prevents the surface of the semiconductor wafer 9 from having positive charge during implantation of ions. FIG. 4 is a schematic sectional view of a conventional electron neutralizing unit, and FIG. 5 is a schematic view of the semiconductor wafer 9 in the direction of the ion beam 1b. The electron neutralizing unit has an electron generating unit 11 and a filament 12. Furthermore, the filament 12 is connected to a filament electric source 13, which is connected to a catch plate 14 through a Faraday cup bias electric source 15.

The thermal electrons generated by supplying electric current to the filament 12 of the electron generating unit 11 during implantation of ions reduce the electric potential of the filament 12 relative to the Faraday cup 16. The thermal electrons generated due to the electric field caused by the low potential are emitted through a slit 17 in the Faraday cup 16. The thermal electrons crash into ions crash the Faraday cup 16 opposite the electron neutralizing unit 10; thereby electrons having a variety of energies, such as recoil electrons and secondary electrons are emitted. Since the surface of the semiconductor wafer 9 is irradiated by these electrons, the positive charge on the surface of the semiconductor wafer 9 ascribed to cations during implantation of ions are neutralized and the surface are prevented from accumulating a positive charge.

Although the number recoil electrons or secondary electrons have been controlled by sending an electric current between the disc 8 and the catch plate 14 as shown in FIG. 4, a disc translation controlling system tends to be adopted in which the number of electrons is controlled by the translational position of the disc 8 (the semiconductor wafer 9).

This controlling system causes a translational movement of the disc 8 in the direction of the radius of the disc 8 (the translational direction B) as well as a rotation of the disc 8 in the rotational direction A. Then a region having the same area as that of the Faraday cup 16, like the electron irradiation region 18, shown in FIG. 5 is irradiated by electrons, so that the positive charge on the semiconductor wafer 9 is neutralized. The amount of electron radiation of the semiconductor wafer 9 is controlled by a disc current Id which is supplied by a control 19 between the disc 8 and the catch plate 14. In the FIG. 4, Ib represents a beam current.

In the above mentioned ion implantation apparatus there is a problem that since the number of electrons is controlled according to the translational movement of the semiconductor wafer 9 (the horizontal direction of FIG. 5), the vicinity of the electron radiation region 20 is irradiated by electrons irrespective of radiation by the ion beam 1b which leads to electrical breakdown because of a negative charge accumlation.

SUMMARY OF THE INVENTION

Accordingly, an object of the present invention is to provide an ion implantation apparatus which can neutralize, homogeneously, positive charge on the surface of a semiconductor wafer by varying locally the number of electrons irradiating the semiconductor wafer.

In order to achieve the above objects, according to one aspect of the present invention, there is provided a ion implantation apparatus comprising: an ion source for generating cations for implantation; an ion drawing electrode for extracting ions generated in the ion source; a mass spectrometer for selecting ions having a predetermined mass from the ions extracted by the ion drawing electrode; a disc having a front side on which a semiconductor wafer may be disposed; and a filament for generating thermal electrons a filament current source for supplying an electric current to the filament; a Faraday cup irradiated with the thermal electrons to produce secondary electrons by; a catch plate placed at a back side of the disc; a pulsed Faraday cup bias electric source connected between the catch plate and the filament for applying a pulsed electrical bias to the Faraday cup; and a control circuit for changing locally the quantity of electrons irradiating the semiconductor wafer in a translational direction of the semiconductor wafer.

DETAILED DESCRIPTION OF THE PREFERRED EMBODIMENTS

Figure 1:
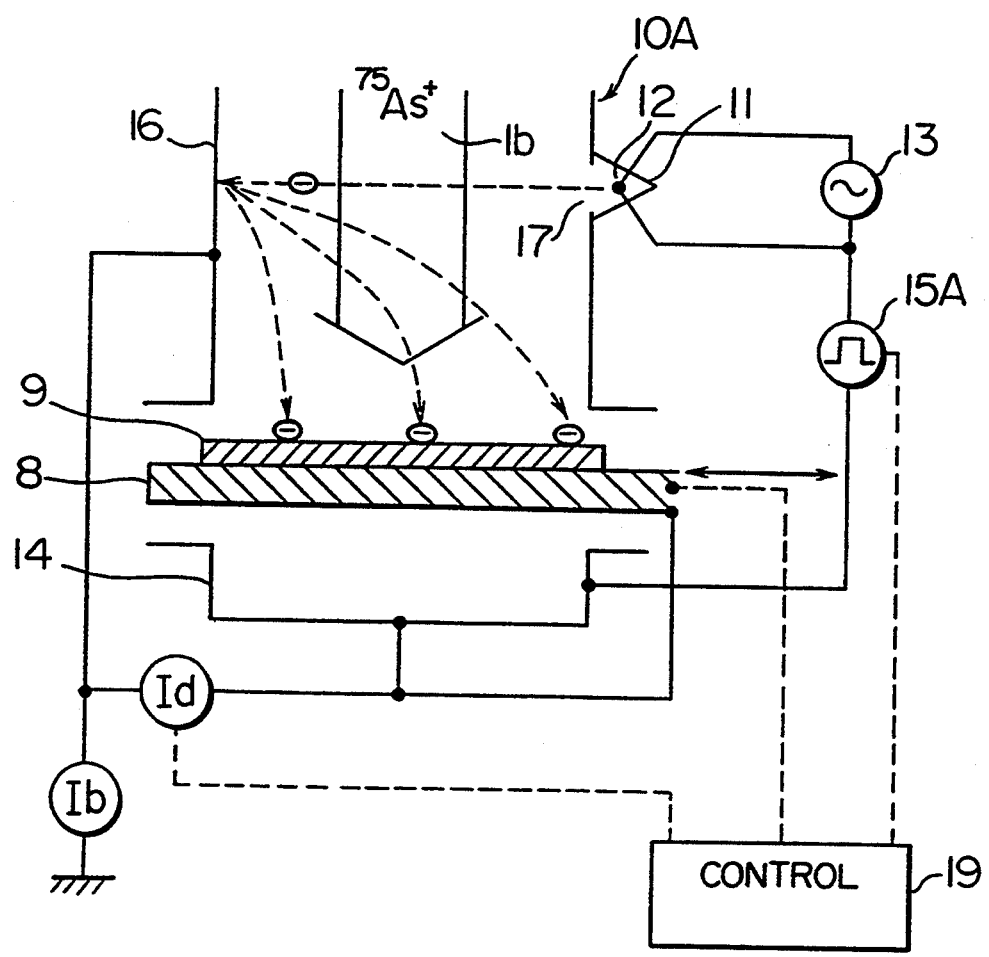
FIG. 1 is a schematic sectional view of the electron neutralizing unit used in an ion implantation apparatus according to an embodiment of the present invention.
Figure 2:
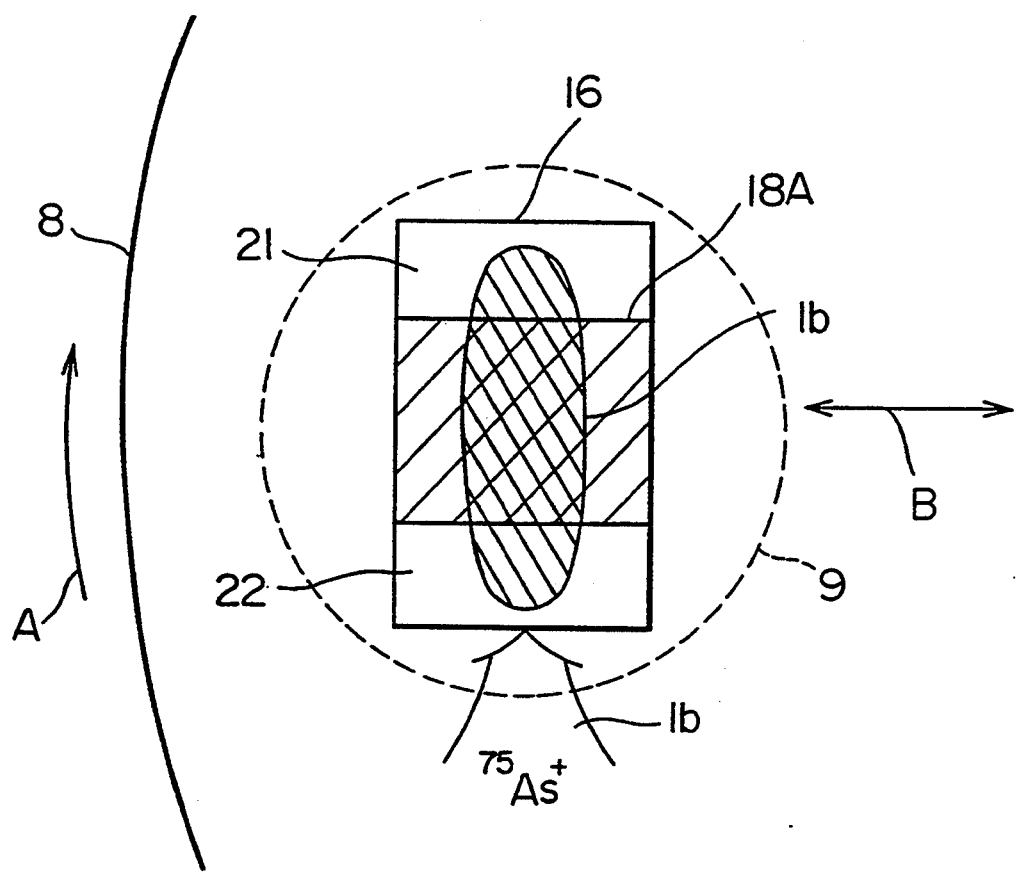
FIG. 2 is a schematic view of the semiconductor wafer shown in FIG. 1 in the direction of ion beam.
Figure 3:
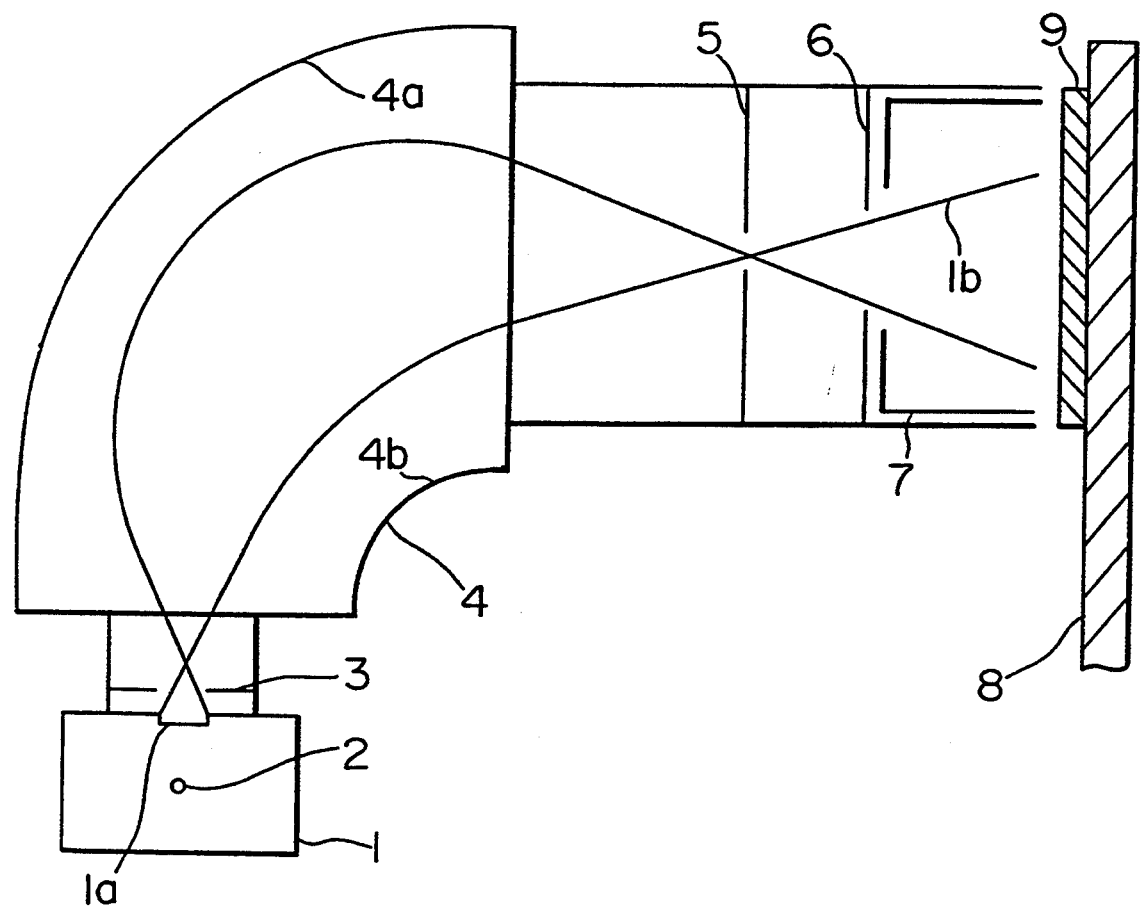
FIG. 3 is a schematic sectional view of an ion implantation apparatus.
Figure 4:
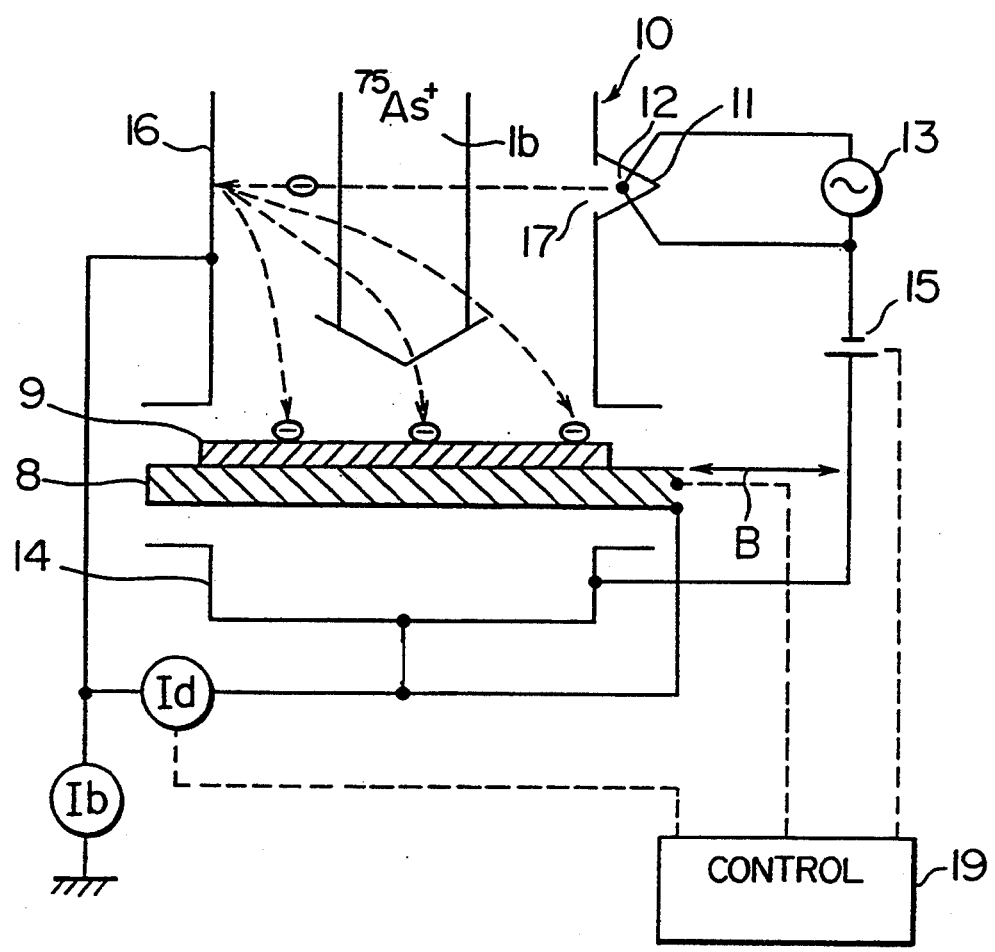
FIG. 4 is a schematic sectional view of a conventional ion implantation apparatus.
Figure 5:
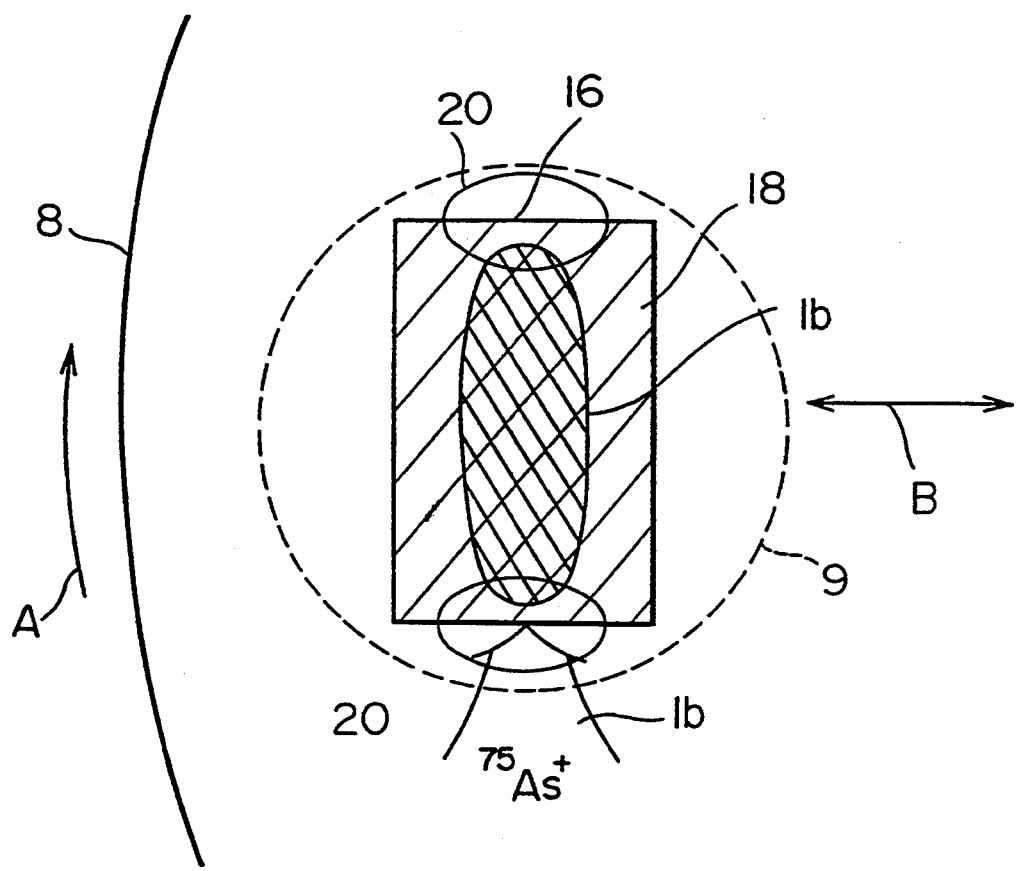
FIG. 5 is a schematic view of a semiconductor wafer in the direction of the ion beam.

FIG. 1 is a schematic construction view of the electron neutralizing unit used in an ion implantation apparatus according to an embodiment of the present invention. The components of the ion implantation apparatus according to the present invention, except the electron neutralizing unit 10A, are the same as shown in FIG. 3. Identical reference number in each Figure represent the identical or corresponding parts. A Faraday cup bias electric source 15A is provided to apply a pulsed Faraday cup bias in the ion implantation apparatus according to the present invention.

As shown in FIG. 3 of the ion implantation apparatus having the above mentioned components, a cation, such as $^{75}As^+$ generated in the arc chamber 1 is extracted by the ion drawing electrode 3, passes through the mass spectrometer 4, the analytical slit 5, the molded slit 6 and the Faraday tube 7, and then irradiates the surface of the semiconductor wafer 9, which is identical to the conventional unit.

Thermal electrons are generated by the electron neutralizing unit 10A shown in FIG. 1 when an electric current is supplied to the filament 12. A control circuit (not shown in Figure) increases the quantity of electrons irradiating the center of the semiconductor wafer that is irradiated by ion beam 1b by translational movement of the disc 8. However, a control system should not change the quantity of electrons in the rotational direction A (above and below the semiconductor wafer 9) of the disc 8.

When the center of the semiconductor wafer 9 is irradiated by ion beam 1b in the rotational direction A of the disc 8 through the control system, a pulsed Faraday cup bias is applied by a source 15A to generate electrons. Because of a high rotation rate of the disc 8, the source 15A applies a pulsed voltage. Furthermore, the quantity of electrons emitted is controlled by the disc current Id flowing between the disc 8 and the catch plate 14. This control is carried out by the control 19.

In the upper part 21 and lower part 22 of the semiconductor wafer, measured along in the rotational direction, no electrons are emitted by the neutralizing unit by controlling the emission of electrons in coordination with the two directions of movement, translation and rotation. Thus the positive charge can be neutralized homogeneously on the surface of the semiconductor wafer 9 to prevent electrical breakdown.

In the above mentioned embodiment the Faraday cup bias is pulsed by source 15A. However, the desired variation in electron emission may be achieved by changing the electric current flowing in the filament 12 by controlling the filament electric current source 13. In this case, the same effects as mentioned above are obtained.

As described above, the ion implantation apparatus according to the present invention can neutralize heterogeneous positive charge on the semiconductor wafer caused during implantation of ions and, therefore, prevent electrical breakdown.

What is claimed is:

1. An ion implantation apparatus comprising:
   an ion source for generating cations for implantation in a semiconductor wafer;
   an ion drawing electrode for extracting ions generated by the ion source;
   a mass spectrometer for selecting ions having a predetermined mass from the ions extracted by the ion drawing electrode;
   a movable disc having a front side on which a semiconductor wafer may be disposed for ion implantation and a back side; and
   means for neutralizing positive charge accumulated on a semiconductor wafer on the movable disc during ion implantation including:
   a filament for generating thermal electrons;
   a filament current source for supplying an electric current to the filament to generate thermal electrons;
   a Faraday cup containing the filament for producing secondary electrons in response to irradiation by the thermal electrons, the secondary electrons reaching the semiconductor wafer on the movable disc and neutralizing positive charge accumulated on the semiconductor wafer;
   a catch plate at the back side of the disc;
   a pulsed bias source connected to the catch plate and the filament for applying a pulsed bias voltage to the Faraday cup; and
   a control circuit connected to the pulsed bias source and the movable disc for locally changing the quantity of electrons irradiating the semiconductor wafer mounted on the disc along a direction of movement of the semiconductor wafer mounted on the disc by controlling the pulsed bias voltage generated by the pulsed bias source in response to movement of the disc.

* * * * *